United States Patent
Morgan et al.

(10) Patent No.: US 12,432,499 B2
(45) Date of Patent: Sep. 30, 2025

(54) INTEGRATED CIRCUITS FOR DRIVING TRANSDUCERS

(71) Applicant: Cirrus Logic International Semiconductor Ltd., Edinburgh (GB)

(72) Inventors: Ross C. Morgan, Bathgate (GB); Michael Robinson, Edinburgh (GB); Itisha Tyagi, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 178 days.

(21) Appl. No.: 18/188,112

(22) Filed: Mar. 22, 2023

(65) Prior Publication Data

US 2023/0328439 A1 Oct. 12, 2023

Related U.S. Application Data

(60) Provisional application No. 63/323,747, filed on Mar. 25, 2022.

(51) Int. Cl.
| | |
|---|---|
| H04R 5/04 | (2006.01) |
| H04R 3/12 | (2006.01) |
| H04R 5/02 | (2006.01) |
| H04S 1/00 | (2006.01) |
| H03F 3/187 | (2006.01) |

(52) U.S. Cl.
CPC ............ *H04R 5/04* (2013.01); *H04R 3/12* (2013.01); *H04R 5/02* (2013.01); *H04S 1/007* (2013.01); *H03F 3/187* (2013.01); *H03F 2200/03* (2013.01); *H04R 2430/01* (2013.01)

(58) Field of Classification Search
None
See application file for complete search history.

(56) References Cited

U.S. PATENT DOCUMENTS

| | | | | |
|---|---|---|---|---|
| 8,411,879 | B2 * | 4/2013 | Guo | H03F 3/45475 |
| | | | | 381/74 |
| 9,906,192 | B2 * | 2/2018 | Lee | H03F 3/187 |
| 10,283,989 | B1 * | 5/2019 | Hogan | H02J 7/0063 |
| 10,601,373 | B2 * | 3/2020 | de Vries | H03F 1/025 |
| 11,750,993 | B2 * | 9/2023 | Chen | H04R 3/04 |
| | | | | 381/58 |
| 2014/0241541 | A1 * | 8/2014 | Li | H04R 5/033 |
| | | | | 381/74 |
| 2014/0270240 | A1 * | 9/2014 | Solomon | H03G 3/007 |
| | | | | 381/86 |
| 2017/0346446 | A1 | 11/2017 | May et al. | |
| 2020/0021256 | A1 | 1/2020 | Terwal et al. | |
| 2021/0175852 | A1 * | 6/2021 | Clarkin | H03F 1/52 |
| 2021/0313936 | A1 | 10/2021 | Garrett et al. | |
| 2022/0048069 | A1 | 2/2022 | Thomsen et al. | |
| 2022/0053267 | A1 * | 2/2022 | Doy | H03K 17/687 |

OTHER PUBLICATIONS

Combined Search and Examination Report under Sections 17 and 18(3), UKIPO, Application No. GB2304198.1, mailed Sep. 11, 2023.

* cited by examiner

*Primary Examiner* — Paul W Huber
(74) *Attorney, Agent, or Firm* — Jackson Walker L.L.P.

(57) ABSTRACT

An integrated circuit (IC), comprising: a first transducer driver for driving a first transducer; a second transducer driver for driving a second transducer; and boost circuitry comprising first and second boost nodes, the boost converter configurable to boost a supply voltage received at one or more input pins of the IC to provide first and second boosted voltages to respective first and second transducer drivers via respective first and second boost nodes.

28 Claims, 5 Drawing Sheets

INTEGRATED CIRCUITS FOR DRIVING TRANSDUCERS

The present disclosure claims priority to U.S. Provisional Patent Application Ser. No. 63/323,747, filed Mar. 25, 2022, each of which is incorporated by reference herein in its entirety.

TECHNICAL FIELD

The present disclosure relates to amplifier integrated circuits (ICs), in particular ICs for driving transducers.

BACKGROUND

There is a trend towards increasing the number of audio transducers provided in consumer electronic devices, such as smartphones and tablets, as well as a need for increased loudness of such audio transducers. To increase loudness, audio transducers in such devices can be driven in the short-term at relatively high power, sometimes an order of magnitude higher than their power rating. To achieve such spikes in power, voltages are required that often exceed supply voltages of integrated circuits (ICs). There is a need to provide such high voltages to an increasing number of loads, in view of the trend to providing more transducers in consumer electronic devices.

SUMMARY

Embodiments of the present disclosure aim to address or at least ameliorate one or more of the above issues by providing multiple transducer drivers on the same silicon die, configurable to drive respective transducers (such as audio transducers) at relatively high voltages with respect to a supply voltage. Whilst the following discussion is in the context of audio, it will be understood that drivers and amplifiers described herein may be used to drive any conceivable transducer, including but not limited to haptic transducers and the like.

According to a first aspect of the disclosure, there is provided an integrated circuit (IC), comprising: a first transducer driver for driving a first transducer; a second transducer driver for driving a second transducer; and boost circuitry comprising first and second boost nodes, the boost converter configurable to boost a supply voltage received at one or more input pins of the IC to provide first and second boosted voltages to respective first and second transducer drivers via respective first and second boost nodes.

Power may be supplied to each of the first and second transducer drivers via both of the first and second boost nodes. Alternatively, power may be supplied to the first transducer driver via the first boost node and to the second transducer driver via the second boost node.

The boost circuitry may comprise: a first boost stage configured to boost the supply voltage to the first boosted voltage at the first boost node; and a second boost stage configured to boost the supply voltage to the second boosted voltage on the second boost node.

The first and second boosted voltages may be equal and the first and second boost nodes may be coupled to a common output node. Alternatively, the first and second boosted voltages may be different, and the first and second boost nodes may be isolated from one another.

The first boost stage may be configured to be coupled to a first inductor external to the IC via a first one of the input pins of the IC. The second boost stage may then be configured to be coupled to a second inductor external to the IC via a second one of the input pins of the IC.

The first and second boost stage may be configured to be coupled to a first inductor external to the IC via a first one of the input pins of the IC.

The boost circuitry may be configured to control the first boost stage in antiphase to the second boost stage.

The boost circuitry may comprise control circuitry configured to control the first and second boost stages using a common control loop. Alternatively, the control circuitry may be configured to control the first and second boost stages independently, i.e. using separate control loops.

The boost circuitry may be operable in one or more modes. For example, in a first mode, the first boost stage may be configured to provide the first boosted voltage to the first transducer driver and the second boost stage is configured to provide the second boosted voltage to the second transducer stage. For example, in a second mode, the first boost stage may be configured to provide the first boosted voltage to the first transducer driver and the second transducer driver. In this second mode, the second boost stage may be held in a low-power mode so as to reduce switching losses associated with the second boost stage.

In another mode, such as the first mode, the first and second boosted voltages may be equal and the first and second boost nodes may be coupled to a common output node. In another mode, such as the second mode, the first and second boosted voltages may be different, and the first and second boost nodes may be isolated from one another.

The boost circuitry may comprise control circuitry configured to switch between the first and second modes in dependence on one or more of the following: a) a signal to be output to the first transducer; b) a signal to be output to the second transducer; c) one or more operational limits of the IC; d) a power level available to the IC.

The control circuitry may be configured to dynamically adjust one or more current limits for each of the first and second transducer drivers in dependence on a total current limit for the IC. Additionally or alternatively, the control circuitry may be configured to adjust one or more of the thermal limits for each of the first and second transducer drivers in dependence on a total thermal limit for the IC or the combined first and second transducer drivers.

The IC may comprise a signal processor configure to: receive an input signal; generate first and second channel signals based on the received input signal; and provide the first and second channel signals to respective first and second transducer drivers, wherein the boost circuitry is controlled in dependence on the first and second channel signals.

The first boosted voltage may be controlled to track a parameter of the first channel signal. The second boosted voltage may be controlled to track a parameter of the second channel signal.

The boost circuitry may comprise: a first switching device coupled between a first inductor node and the first boost node; a second switching device coupled between the first inductor node and a ground reference voltage; a third switching device coupled between a second inductor node and the second boost node; and a fourth switching device coupled between the second inductor node and the ground reference voltage.

The IC of claim 4, wherein the first boosted voltage and/or the second boosted voltage in dependence on an output of the first transducer driver and/or the second transducer driver.

The IC of any one of the preceding claims, wherein the boost circuitry comprises inductive boost circuitry and/or capacitive boost circuitry.

According to another aspect of the disclosure, there is provided an IC, comprising: a first boosted amplifier for driving a first transducer; a boosted amplifier for driving a second transducer; and boost circuitry for providing boosted supply voltages to the first and second boosted amplifiers, wherein the IC is configurable in a first mode and a second mode, wherein: in the first mode, the boost circuitry provides separate first and second boosted voltages to separate first and second boosted voltage supply rails, the first boosted voltage for supplying the first boosted amplifier and the second boosted voltage for supplying the second boosted amplifier; and in a second mode, the boost circuitry provides a common boosted voltage to a common boost voltage supply rail, the common boosted voltage for supplying the first boosted amplifier and the second boosted amplifier.

According to another aspect of the disclosure, there is provided an integrated circuit (IC), comprising: a first transducer driver; a second transducer driver; and boost circuitry comprising first and second boost nodes, the boost converter configurable to boost a supply voltage received at one or more input pins of the IC to provide first and second boosted voltages to respective first and second transducer drivers via respective first and second boost nodes.

The first and second transducer drivers may be configured to drive a transducer as a bridge-tied load.

Any of the ICs described above may be an audio IC and the first and second transducers may be audio transducers.

Any of the ICs described above may be a haptic IC and the first and second transducers may be haptic transducers.

According to another aspect of the disclosure, there is provided a system comprising: the IC of any one of the preceding claims; and the first and second transducers.

The system may further comprise: one or more inductors coupled to the boost circuitry, each inductor coupled to the boost circuitry via a respective inductor pin of the IC.

The system may further comprise: one or more capacitors coupled to the boost circuitry, each capacitor coupled to the boost circuitry via a respective capacitor pin of the IC.

According to another aspect of the disclosure, there is provided an electronic device comprising an IC as described above and/or a system as described above.

The electronic device may comprise one of a wearable device, a vehicle, a mobile computing device, a laptop computer, a tablet computer, a games console, a remote-control device, a home automation controller or a domestic appliance, a toy, a robot, an audio player, a video player, or a mobile telephone, and a smartphone.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

BRIEF DESCRIPTION OF DRAWINGS

Embodiments of the present disclosure will now be described by way of non-limiting examples with reference to the drawings, in which.

DESCRIPTION OF EMBODIMENTS

Embodiments of the present disclosure relate to the provision of multiple transducer drivers on a single integrated circuit (IC) or silicon die. Each transducer driver may be configurable to drive a respective, off-chip, transducer (such as an audio transducer) at voltage levels exceeding a supply voltage of the IC. Such voltages levels may be obtained using boost circuitry configured to boost the supply voltage of the IC to one or more boosted voltage levels for supplying power to the multiple transducer drivers.

Whilst the following discussion is in the context of audio, it will be understood that drivers/amplifiers described herein may be configured to drive any conceivable transducer, including but not limited to haptic transducers and the like. Whilst the following discussion is in relation to a dual-channel amplifier (i.e., an IC configured to amplify input signals in two channels using two transducer drivers), the present disclosure is not limited to ICs having only two channels. Embodiments described herein may be extended to any number of channels, such as three or four channels, each channel having a transducer driver for driving a respective transducer.

Figure 1:
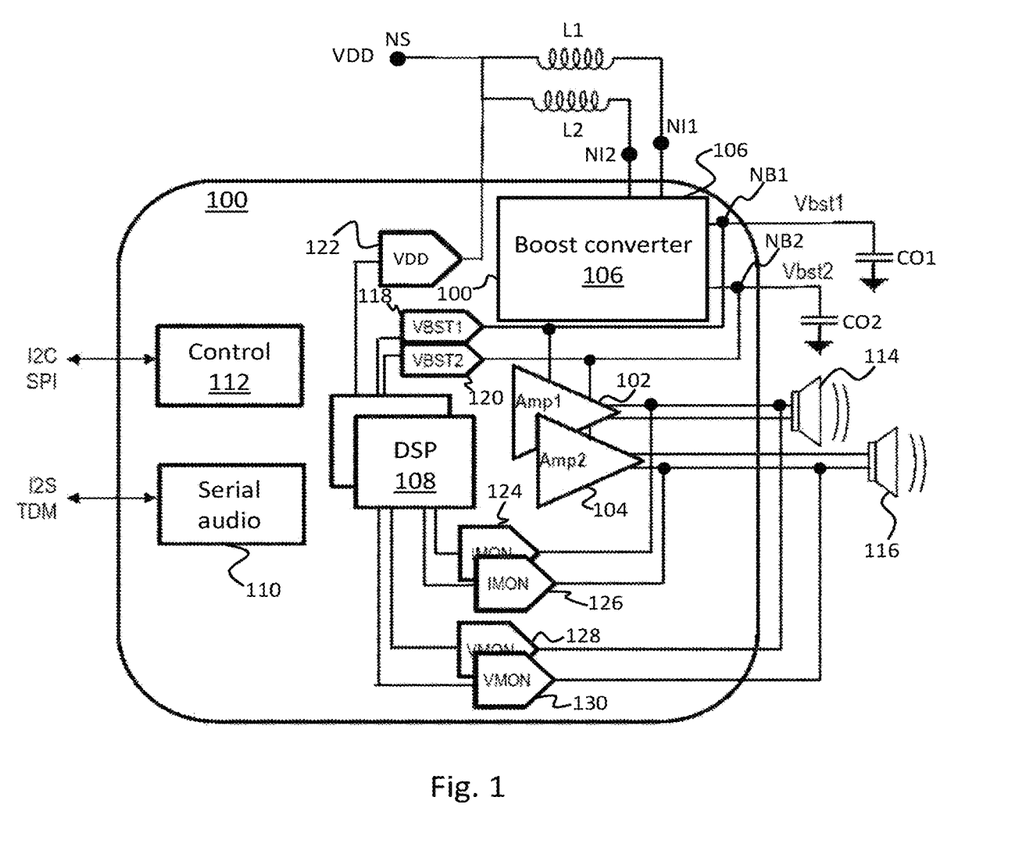
FIG. 1 is a schematic diagram of an integrated circuit (IC) for driving multiple transducers.

FIG. 1 is a schematic illustration of an example implementation of a dual channel amplifier integrated circuit (IC) 100, comprising first and second transducer drivers (or amplifiers) 102, 104 and a boost converter 106. Optionally, the IC further comprises a digital signal processor (DSP) 108, an audio serial port 110 and a control module 112.

The first and second transducer drivers 102, 104 are configured to drive respective first and second transducers 114, 116 external to the IC 100. The first and second transducer drivers 102, 104 may have differential outputs (as depicted in FIG. 1) or single ended outputs. Outputs of the first and second transducer drivers 102, 104 may be coupled to respective first and second transducers 114, 116 via output pins of the IC 100. In a variation of this arrangement, the first and second transducer drivers 102, 104 may be configured to drive a single transducer in a bridge-tied load configuration, such that that single transducer bridges the output terminals of the first and second transducer drivers 102, 104. The skilled person will appreciate that such a configuration increased the range of voltage swing at the transducer when compared to a transducer connected to a single transducer driver and ground.

The boost converter 106 may be configured to supply first and second boosted voltages Vbst1, Vbst2 via respective first and second boost nodes NB1, NB2 to respective first and second transducer drivers 102, 104. As such, the first boosted voltage Vbst1 is provided as the supply voltage to the first transducer driver 102 and the second boosted voltage Vbst2 is provided as the supply voltage to the second transducer driver 104. As will be explained in more detail below, the first and second boosted voltage Vbst1, Vbst2 may be independently controlled, or alternatively may be driven by a common supply.

First and second output capacitors CO1, CO2 may be coupled between respective first and second boost nodes NB1, NB2 and a ground reference (GND). The first and second output capacitors CO1, CO2 are preferably provided external to the IC 100 as shown in FIG. 1. In other embodiments, the first and second output capacitors CO1, CO2 may be provided on the IC 100. In some embodiments, depending on a mode of operation or topology implemented in the boost converter 106, only one of the first and second output capacitors CO1, CO2 may be provided.

First and second inductors L1, L2 may be provided, each coupled between a supply node NS and the boost converter 106 at respective first and second inductor nodes NI1, NI2. The first and second inductors L1, L2 are preferably provided external to the IC 100 as shown in FIG. 1. In other embodiments, the first and second inductors L1, L2 may be provided on the IC 100. In some embodiments, depending on a mode of operation or topology implemented in the boost converter 106, only one of the first and second inductors L1, L2 may be provided.

The DSP 108, when provided, may be configured to receive signals representing one or more of a supply voltage VDD at the supply node NS, the first and second boosted voltage Vbst1, Vbst2, and outputs of the first and/or second transducer drivers 102, 104.

For example, the first and second boosted voltage Vbst1, Vbst2 may be provided to respective first and second boost voltage monitors 118, 120 configured to monitor respective first and second boosted voltage Vbst1, Vbst2 and output boost voltage information to the DSP 108. Thus, the first and second boost voltage monitors 118, 120 may be coupled between respective first and second boost nodes NB1, NB2 and the DSP 108. The supply voltage VDD may be provided to a supply voltage monitor 122 configured to monitor the supply voltage VDD and output supply voltage information to the DSP 108. First and second current monitors 124, 126 may be provided between respective outputs of the first and second transducer drivers 102, 104 and the DSP 108 for relaying information regarding output currents at outputs of the first and second transducer driver 102, 104 to the DSP 108. First and second voltage monitors 128, 130 may be provided between respective outputs of the first and second transducer drivers 102, 104 and the DSP 108 for relaying information regarding output voltages at outputs of the first and second transducer drivers 102, 104 to the DSP 108.

The control module 112 may be configured to implement control of the boost converter 106 and/or the transducer drivers 102, 104 (as will be described below). The control module 112 may have stored therein one or more predefined operational limits and/or parameters. The control module 112 may be configured to control operation of the boost converter 106 and/or the transducer drivers 102, 104 according to such stored operational limits and/or parameters. Such limits may be based on one or more specified voltage, current or thermal limits. Such limits may be based on diagnostic signals received from or derived from one or more of the transducers 114, 116. The control module 112 may be configured to communicate via a serial interface (e.g., 12C) with one or more devices external to the IC 100.

The audio serial port 110 may be configured to receive one or more input audio signals via a serial interface (e.g., 12C). The received input audio signals may be processed, for example by the DSP 108 to generate first and second channel signals to be provided as inputs to respective first and second transducer drivers 102, 104.

During operation, the boost converter 106 may be configured to boost the supply voltage VDD provided to the one or more inductors L1, L2 at the supply node NS such that the first and second boosted voltages Vbst1, Vbst2 provided to the transducer drivers 102, 104 may exceed a level of the supply voltage VDD.

Figure 2:
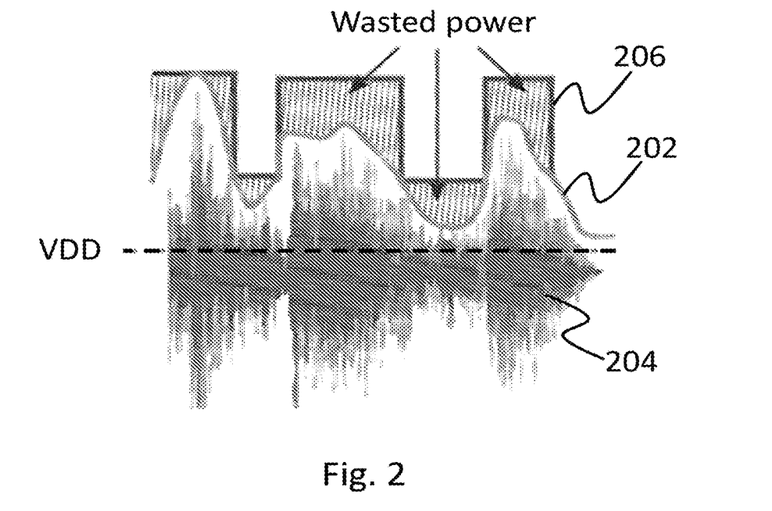
FIG. 2 is a graphical illustration comparing class-G and class-H amplifier supply voltages.

The boost converter 106 and the first and second transducer drivers 102, 104 may be configured to implement a boosted class-H amplifier scheme. In doing so, the boost converter 106 may be configured to boost supply voltage provided to the first and/or second transducer driver 102, 104 to closely track outputs of the first and second transducer drivers 102, 104 (i.e., tracking the output audio signal envelope of the first and second transducer drivers 102, 104). FIG. 2 graphically illustrates an example class-H supply voltage 202 in comparison to a corresponding class-G supply voltage 206 for a single channel transducer driver. It can be seen that the class-H supply voltage 202 closely tracks the output signal 204 of the transducer driver, whereas the class-G supply voltage 206 tracks the supply voltage in a stepwise fashion. By implementing a class-H scheme, improved efficiency can be ascertained due to the supply voltage for each of the first and second transducer drivers 102, 104 closely tracing the output of respective drivers 102, 104.

Preferably, the boost converter 106 may be configured to independently drive the first and second boosted voltages Vbst1, Vbst2. In doing so, the supply voltage provided to each of the first and second transducer drivers 102, 104 can be independently controlled to track respective outputs of the first and second transducer drivers 102, 104. Power efficiency of each of the first and second channels can thus be improved since each channel's boost supply level can track the content of that channel.

Various example topologies of the boost converter 106 will now be described with reference to FIGS. 3 to 6. The following topologies are provided as examples only. Whilst in these examples, the various boost stages are arranged as inductive boost stages, the present disclosure is not so limited. In other embodiments, any one of the boost stages may be implemented as non-inductive boost stages, such as capacitive boost stages. Additionally or alternatively, any one of the boost stages described herein may be implemented as a multi-level boost stage configured to boost a supply voltage to multiple voltage ranges above the supply voltage. Such topologies are known in the art and so will not be described in more detail here.

Figure 3:
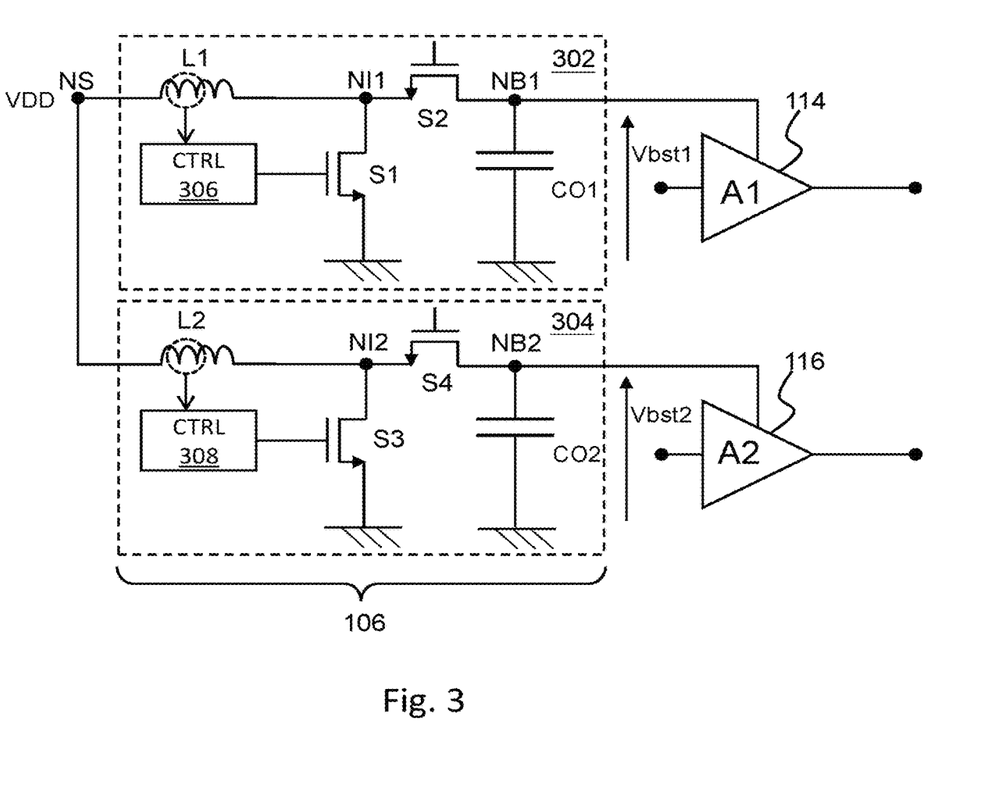
FIG. 3 is a schematic diagram of an example implementation of a boost converter of the IC of FIG. 1.

FIG. 3 is a schematic diagram of an example implementation of the boost converter 106. In this example, the boost converter 106 comprises a dual-stage mono design having first and second boost stages 302, 304 configured to provide first and second boosted voltage Vbst1, Vbst2 to separate supply rails of the first and second transducer drivers 102, 104.

The first boost stage 302 comprises a first control module 306 and first and second switches S1, S2. The first switch S1 is coupled between the first inductor node NI1 and a ground reference (GND). The second switch S2 is coupled between the first inductor node NI1 and the first boost voltage node NB1. As shown in FIG. 1, the first output capacitor CO1 is coupled between the first boost voltage node NB1 and the ground reference (GND). The second boost stage 304 comprises a second control module 308 and third and fourth switches S3, S4. The third switch S3 is coupled between the second inductor node NI2 and a ground reference (GND).

The fourth switch S4 is coupled between the second inductor node NI2 and the second boost voltage node NB2. As shown in FIG. 1, the second output capacitor CO2 is coupled between the second boost voltage node NB2 and the ground reference (GND). The first and/or second control modules 306, 308 may be implemented by the control module 112 shown in FIG. 1.

Whilst in FIG. 3, the first and second control modules 306, 308 are provided separately, in other embodiments, the first and second control modules 306, 308 may be implemented as a single module. The switches S1, S2, S3, S4 described herein may be implemented using any suitable technology, for example as transistor switches (e.g., MOSFETs). Optionally, the second and fourth switches S2, S4 may respectively be replaced with diodes in forward bias.

The first control module 306 is configured to control the first and second switches S1, S2 to boost the supply voltage VDD at the supply node NS to the first boosted voltage Vbst1 at the first boost node NB1.

The second control module 308 is configured to control the third and fourth switches S3, S4 to boost the supply voltage VDD at the supply node NS to the second boosted voltage Vbst2 at the second boost node NB2.

Operation of the first and second boost stages 302, 304 is known in the art and so will not be described in detail here. However, in short, the implementation shown in FIG. 3 enables two separate boosted voltage Vbst1, Vbst2 to be independently controlled such that each can track a respective output of the first and second transducer drivers 102, 104.

Figure 4:
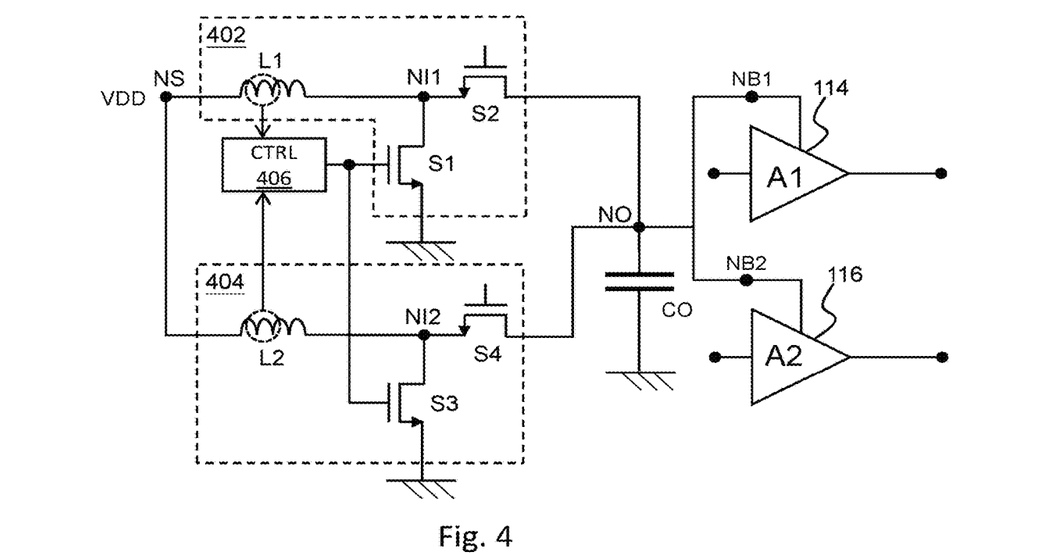
FIG. 4 is a schematic diagram of an example implementation of a boost converter of the IC of FIG. 1.

FIG. 4 is a schematic diagram of another example implementation of the boost converter 106. In this example, the boost converter 106 comprises a dual-stage stereo design in which first and second (separate) boost stages 402, 404 are operated in an interleaved or antiphase relationship to drive a common output capacitor CO.

The first boost stage 402 comprise a first switch S1 coupled between the first inductor node NI1 and a ground reference (GND), and a second switch S2 coupled between the first inductor node NI1 and a common output node NO. The second boost stage 404 comprises a third switch S3 coupled between the second inductor node NI2 and the ground reference (GND), and a fourth switch S4 coupled between the second inductor node NI2 and the common output node NO. The common output node NO is coupled to both of the first and second boost voltage node NB1, NB2. The common output capacitor CO is coupled between the common output node NO and ground (GND). It will be appreciated that the common output capacitor CO may be implemented in the example shown in FIG. 1 as the combined capacitance of the first and second output capacitors CO1, CO2 shown in that Figure.

A control module 406 is provided to control switching of the first, second, third and fourth switches S1: S4 optionally in dependence on a state of the first and/or second inductors L1, L2. The control modules 406 may be implemented by the control module 112 shown in FIG. 1.

During operation, the control module 406 is configured to switch the first and second boost stages 402, 404 in antiphase such that when the first inductor L1 is being energised by the supply voltage VDD, the second inductor L2 is being de-energised, thereby boosting the voltage at the output node NO. For example, the control module 406 may be configured to control the switches S1: S4 such that when the first and fourth switches S1, S4 are closed, the second and third switches S2, S3 are open, and vice versa.

The arrangement shown in FIG. 4 has the advantage that, regardless of phase, one of the first and second inductors L1, L2 is being de-energised to the output node NO, thereby reducing ripple of the first and second boosted voltages Vbst1, Vbst2 when compared to a single boost stage arrangement. The arrangement shown in FIG. 4 has a drawback, when compared to the arrangement of FIG. 3, in that the first and second boosted voltages Vbst1, Vbst2 cannot be independently controlled, since they are driven by a single output node NO.

Figure 5:
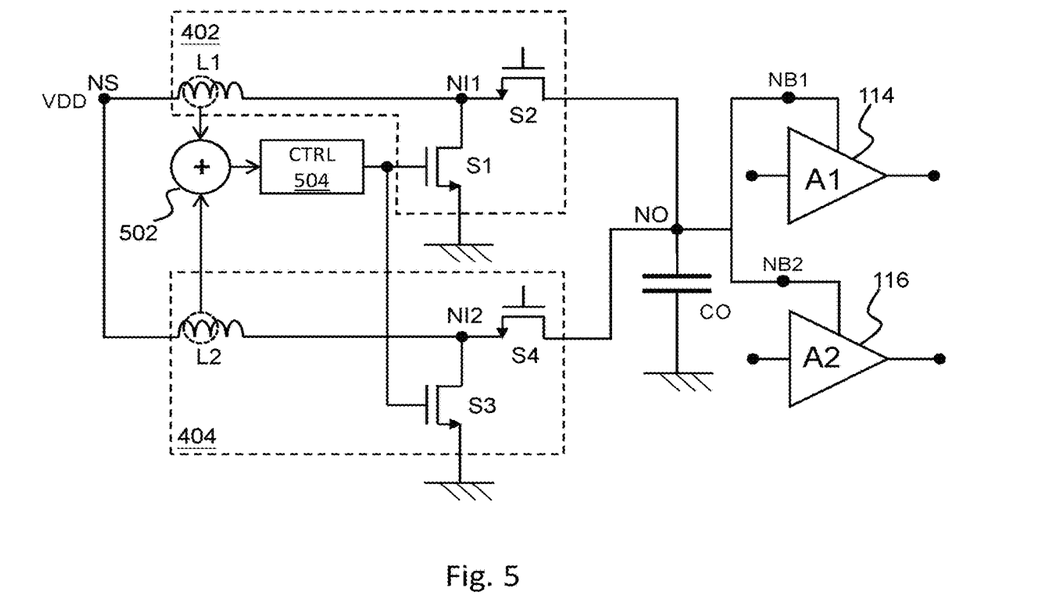
FIG. 5 is a schematic diagram of an example implementation of a boost converter of the IC of FIG. 1.

FIG. 5 is a schematic diagram of another example implementation of the boost converter 106 which is a variation of the implementation shown in FIG. 4, like parts being given like numbering. The boost converter 106 in this implementation comprises a dual-stage parallel design in which the first and second boost stages 402, 404 are operated with a common control loop. The control module 406 of FIG. 4 is replaced with an adder 502 and a control module 504. The adder 502 and the control module 504 may be implemented by the control module 112 shown in FIG. 1. Inductor state information from the first and second inductors L1, L2 is combined at the adder 502 before being provided to the control module 504. The overall implementation size of the control circuitry of this arrangement is smaller when compared to the implementations shown in FIGS. 3 and 4.

Figure 6:
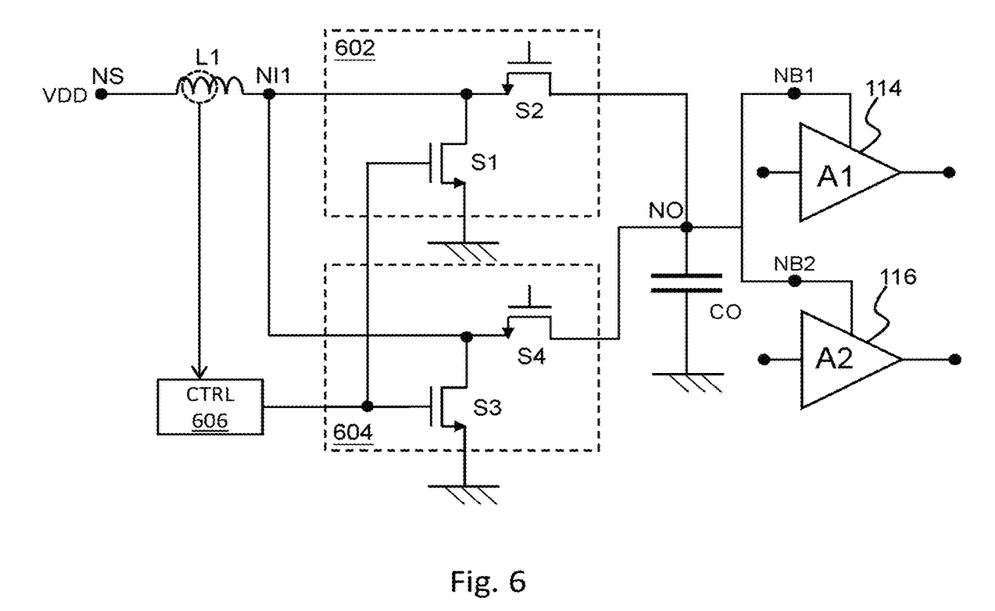
FIG. 6 is a schematic diagram of an example implementation of a boost converter of the IC of FIG. 1.

FIG. 6 is a schematic diagram of another example implementation of the boost converter 106 which uses a single inductor L1. In this example, the boost converter 196 comprises a dual-stage parallel design in which a shared inductor L1 is coupled to first and second boost stages 602, 604. In contrast to the arrangement shown in FIG. 4, the first and second boost stages 602, 604 are operated in phase to drive a common output capacitor CO. As will be explained in more detail below, this has the advantage of reducing condition losses during high load conditions in addition to the ability to reduce switching losses during low load condition by disabling one of the first and second boost stages 602, 604.

The first boost stage 602 comprise a first switch S1 coupled between the first inductor node NI1 and a ground reference (GND), and a second switch S2 coupled between the first inductor node NI1 and a common output node NO. The second boost stage 604 comprises a third switch S3 coupled between the first inductor node NI1 and the ground reference (GND), and a fourth switch S4 coupled between the first inductor node NI1 and the common output node NO. The common output node NO is coupled to both of the first and second boost voltage node NB1, NB2. The common output capacitor CO is coupled between the common output node NO and ground (GND). It will be appreciated that the common output capacitor CO may be implemented in the example shown in FIG. 1 as the combined capacitance of the first and second output capacitors CO1, CO2 shown in that Figure. It will be appreciated that in this arrangement, the second inductor L2 need not be connected to the second inductor node IN2 of the IC 100 shown in FIG. 1.

A control module 606 is provided to control switching of the first, second, third and fourth switches S1: S4 optionally in dependence on a state of the common inductor L1. The control modules 606 may be implemented by the control module 112 shown in FIG. 1.

During operation, the control module 606 is configured to switch the first and second boost stages 402, 404 in phase. That is, control module 606 is configured to close the first and third switches S1, S3 when the second and fourth switches S2, S4 are open, and vice versa. As such, the shared inductor L1 is simultaneously energised through the first and third switches S1, S3 or de-energised through the second and fourth switches S2, S4. This arrangement has several advantages. For example, sharing the inductor L1 between first and second boost stages 402, 404 reduces external component cost. In addition, during low/light load conditions, one of the first and second boost stages 402, 404 may be disabled (for example by opening the first and second switches S1, S2 or opening the third and fourth switches S3, S4), which in turn reduces switching losses associated with switching two of the four switches S1: S4. Conversely, during high/heavy load conditions, the first and second boost stages 402, 404 may be enabled, which in turn reduces conduction losses (and therefore increases efficiency) during such high/heavy load conditions. The control module 606 may be configured to disable and/or enable the first and/or second boost stages 402, 404 in dependence on a load condition, for example at the first and/or second transducer drivers 102, 104 (as described in more detail below).

In some embodiments, the boost converter 106 may implement any combination of the above topologies described with reference to FIGS. 3 to 6. For example, the IC 100 may be operable to switch between different topologies (such as those described above) or modes as appropriate. It will be understood that the IC 100 (e.g., the boost converter 106) may have one or more additional switches (not shown) to allow selective connection and/or disconnection of various nodes to accommodate switching between different topologies. For example, referring to FIG. 3, a switch may be provided between the first and second voltage boost nodes NB1, NB2 which, when closed, change the switch topology to substantially match that shown in FIGS. 4 to 6. The control modules 306, 308 may then operate to control the switching in manner similar to that described with reference to any one of FIGS. 4 to 6.

Switching between different topologies or choosing a specific topology may be based on one or more of: a specific use case, one or more power levels, such as power levels at the outputs of the transducer drivers 102, 204, current limits of the inductor(s) L1, L2, thermal limits of one or more elements of the IC 100, etc. For example, as noted above, a control module (e.g., 112, 406, 504, 606, 306, 308) may be configured to enable a disabled one of the first and second boost stages 402, 404 in response to a load condition exceeding a predetermined threshold and/or in response to a thermal condition exceeding a predetermined threshold. For example, in response to detection of a high temperature condition in an enabled one of the first and second boost stages 402, 404, a control module may be configured to enable a disabled one of the first and second boost stages 402, 404 to reduce thermal stress on the previously enabled boost stage. In another example, one or more measurements of efficiency may be performed on the IC 100 to determine whether to switch between operation topologies or modes. For example, if it is determined that an efficiency of the boost converter 106 falls below a predetermined threshold, a control module (e.g., 112, 406, 504, 606, 306, 308) may enable or disable one of the first and second boost stages 402, 404 to improve efficiency of the boost converter 106.

In some embodiments, the IC 100 may be reconfigurable, for example by a user, to operate using one of the described topologies/modes above. Such operation may be reconfigured by appropriate connection of external components. For example, a user may select the use of one or both of the output capacitors CO1, CO2 and/or one or both of the inductors L1, L2 etc. to operate the boost converter 106 in any of the modes described with reference to FIGS. 3 to 6.

As noted above with reference to FIG. 1, the control module 112 may be configured to control operation of the boost converter 106 and/or the transducer drivers 102, 104. For example, the IC 100 may have a predefined total current limit, which may be based on the sum of individual current limits for separate channels for driving respective first and second transducers 114, 116 (e.g., separate 3.5A current limits resulting in a 7A total current limit). Since two transducers 114, 116 are driven by a single IC 100, the control module 112 can efficiently and dynamically adjust current limits for each channel individually, without requiring additional communication and/or synchronisation circuitry which would otherwise be required if each transducer 114, 116 was driven by a separate driver IC.

It will be appreciated that the IC 100 may be configured to drive two transducers having different properties. For example, the first transducer 114 may be a loudspeaker and the second transducer 116 may be an earpiece speaker. In this example, the second (earpiece) transducer 116 may have a lower excursion than the first (loudspeaker) transducer 114 and/or the transducers 114, 116 may have different power dissipation levels. If this is the case, the transducers 114, 116 will have different operational limits and be driven as such by respective first and second transducer drivers 102, 104.

Figure 7:
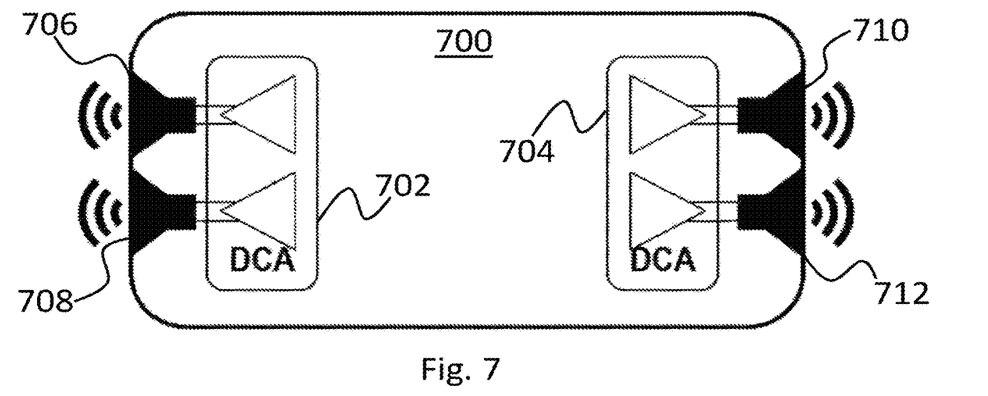
FIG. 7 is a schematic illustration of a device comprising two amplifier ICs such as that shown in FIG. 1.
Figure 8:
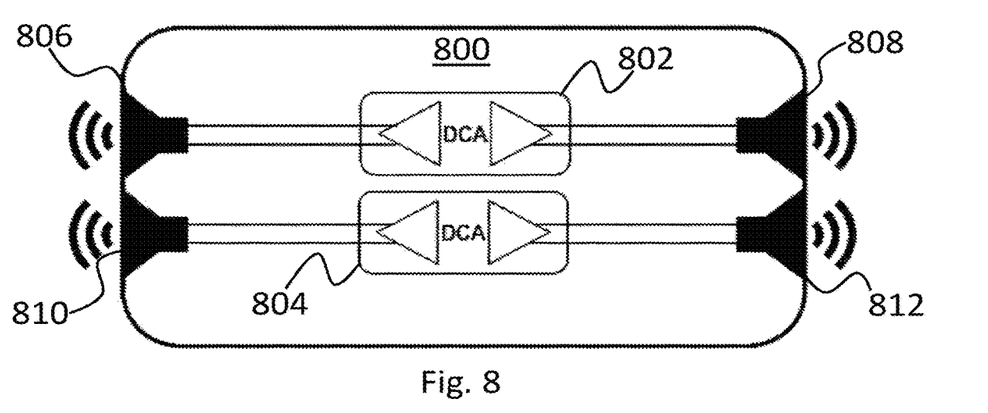
FIG. 8 is a schematic illustration of a device comprising two amplifier ICs such as that shown in FIG. 1.
Figure 9:
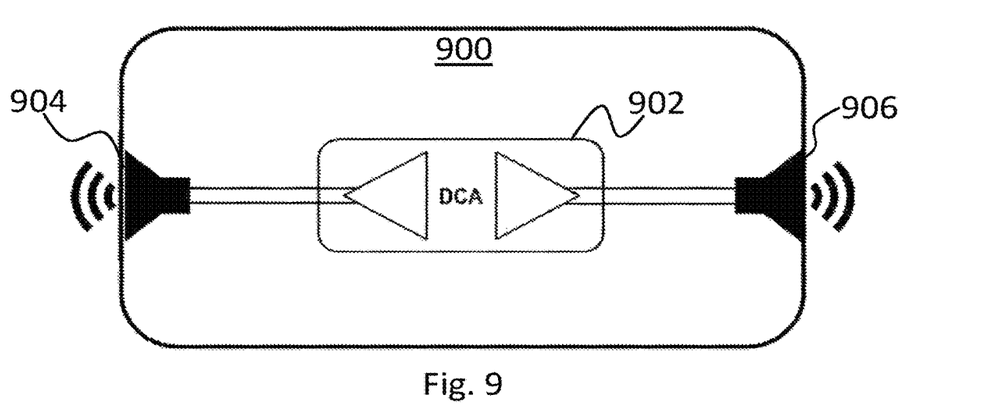
FIG. 9 is a schematic illustration of a device comprising an amplifier IC such as that shown in FIG. 1.

ICs such as the IC 100 described herein may be used specifically to drive two or more transducers (such as audio transducers) of an electronic device, such as a smart phone or tablet. FIGS. 7 to 9 illustrate various configurations of the IC 100.

FIG. 7 illustrates a device 700 comprising first and second dual-channel amplifier (DCA) ICs 702, 704 which may each comprise the IC 100 of FIG. 1. The first DCA IC 702 is configured to drive first and second transducers 706, 708 arranged at a first end of the device 700. The second DCA IC 704 is configured to drive third and fourth transducers 710, 712 arranged at a second end of the device 700 opposite the first end. The first and second transducers 706, 708 may be implemented as a tweeter and a subwoofer respectively, with the third and fourth transducers 710, 712 being operated as a tweeter and subwoofer respectively. Alternatively, the first to fourth transducers 706:712 may all operate across the same frequency range similarly. It will be appreciated that driving multiple proximate transducers with a common IC reduces real estate associated with connections between the IC and the multiple transducers.

FIG. 8 illustrates a device 800 comprising first and second dual-channel amplifier (DCA) ICs 802, 804 which may each comprise the IC 100 of FIG. 1. The first DCA IC 802 is configured to drive first and second transducers 806, 808. The second DCA IC 804 is configured to drive third and fourth transducers 810, 812. In this arrangement, the first and second transducers 806, 808 are arranged at opposite ends of the device 800 and the third and fourth transducers 810, 812 are arranged at opposite ends of the device 800. The first and third transducers 806, 810 may be implemented as a tweeter and a subwoofer respectively, with the second and fourth transducers 808, 812 being operated as a tweeter and subwoofer respectively. Alternatively, the first to fourth transducers 806:812 may all operate across the same frequency range similarly.

FIG. 9 illustrates a device 900 comprising a single dual-channel amplifier (DCA) IC 902 which may comprise the IC 100 of FIG. 1. The DCA IC 902 is configured to drive first and second transducers 904, 906 arranged at opposite ends of the device 900. In this arrangement, the first transducer 904 may be a bottom speaker or loudspeaker and the second transducer 906 may be an earpiece speaker. This arrangement may be particularly applicable when the device 900 is a smartphone. Alternatively, the first and second transducers 904, 906 may be configured to operate across the same frequency range.

The skilled person will recognise that some aspects of the above-described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog TM or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

Note that as used herein the term module shall be used to refer to a functional unit or block which may be implemented at least partly by dedicated hardware components such as custom defined circuitry and/or at least partly be implemented by one or more software processors or appropriate code running on a suitable general purpose processor or the like. A module may itself comprise other modules or functional units. A module may be provided by multiple components or sub-modules which need not be co-located and could be provided on different integrated circuits and/or running on different processors.

Embodiments may be implemented in a host device, especially a portable and/or battery powered host device such as a mobile computing device for example a laptop or tablet computer, a games console, a remote control device, a home automation controller or a domestic appliance including a domestic temperature or lighting control system, a toy, a machine such as a robot, an audio player, a video player, or a mobile telephone for example a smartphone.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

The invention claimed is:

1. An integrated circuit (IC), comprising:
a first transducer driver for driving a first transducer;
a second transducer driver for driving a second transducer; and
boost circuitry comprising first and second boost nodes, the boost circuitry configurable to boost a supply voltage received at one or more input pins of the IC to provide first and second boosted voltages to respective first and second transducer drivers via respective first and second boost nodes;
wherein the boost circuitry comprises:
a first boost stage configured to boost the supply voltage to the first boosted voltage at the first boost node; and
a second boost stage configured to boost the supply voltage to the second boosted voltage on the second boost node; and wherein the first and second boosted voltages are different, and the first and second boost nodes are isolated from one another.

2. The IC of claim 1, wherein power is supplied to the first transducer driver via the first boost node and to the second transducer driver via the second boost node.

3. The IC of claim 1, wherein the first boost stage is configured to be coupled to a first inductor external to the IC via a first one of the input pins of the IC and wherein the second boost stage is configured to be coupled to a second inductor external to the IC via a second one of the input pins of the IC.

4. The IC of claim 1, wherein the first and second boost stage are configured to be coupled to a first inductor external to the IC via a first one of the input pins of the IC.

5. The IC of claim 1, comprising a signal processor configure to:
receive an input signal;
generate first and second channel signals based on the received input signal; and
provide the first and second channel signals to respective first and second transducer drivers, wherein the boost circuitry is controlled in dependence on the first and second channel signals.

6. The IC of claim 5, wherein the first boosted voltage is controlled to track a parameter of the first channel signal, and wherein the second boosted voltage is controlled to track a parameter of the second channel signal.

7. The IC of claim 1, wherein the boost circuitry comprises:
a first switching device coupled between a first inductor node and the first boost node;
a second switching device coupled between the first inductor node and a ground reference voltage;
a third switching device coupled between a second inductor node and the second boost node; and
a fourth switching device coupled between the second inductor node and the ground reference voltage.

8. The IC of claim 1, wherein the first boosted voltage and/or the second boosted voltage is controlled in dependence on an output of the first transducer driver and/or the second transducer driver.

9. The IC of claim 1, wherein the IC is an audio IC and the first and second transducers are audio transducers, or wherein the IC is a haptic IC and the first and second transducers are haptic transducers.

10. A system comprising:
the IC of claim 1; and
the first and second transducers.

11. The system of claim 10, further comprising:
one or more inductors coupled to the boost circuitry, each inductor coupled to the boost circuitry via a respective inductor pin of the IC; and
one or more capacitors coupled to the boost circuitry, each capacitor coupled to the boost circuitry via a respective capacitor pin of the IC.

12. An electronic device comprising the IC of claim 1.

13. The electronic device of claim 12, wherein the device comprises one of a wearable device, a vehicle, a mobile computing device, a laptop computer, a tablet computer, a games console, a remote-control device, a home automation controller or a domestic appliance, a toy, a robot, an audio player, a video player, or a mobile telephone, and a smartphone.

14. An integrated circuit (IC), comprising:
a first transducer driver for driving a first transducer;
a second transducer driver for driving a second transducer; and
boost circuitry comprising first and second boost nodes, the boost circuitry configurable to boost a supply voltage received at one or more input pins of the IC to provide first and second boosted voltages to respective first and second transducer drivers via respective first and second boost nodes;
the IC further comprising a signal processor configured to:
receive an input signal;
generate first and second channel signals based on the received input signal; and
provide the first and second channel signals to respective first and second transducer drivers, wherein the boost circuitry is controlled in dependence on the first and second channel signals.

15. The IC of claim 14, wherein power is supplied to each of the first and second transducer drivers via both of the first and second boost nodes.

16. The IC of claim 14, wherein the boost circuitry comprises:
a first boost stage configured to boost the supply voltage to the first boosted voltage at the first boost node; and
a second boost stage configured to boost the supply voltage to the second boosted voltage on the second boost node.

17. The IC of claim 16, wherein the first and second boosted voltages are equal, and wherein the first and second boost nodes are coupled to a common output node.

18. The IC of claim 16, wherein the first and second boosted voltages are different, and the first and second boost nodes are isolated from one another.

19. The IC of claim 16, wherein the boost circuitry is configured to control the first boost stage in antiphase to the second boost stage.

20. The IC of claim 16, wherein in a first mode, the first boost stage is configured to provide the first boosted voltage to the first transducer driver and the second boost stage is configured to provide the second boosted voltage to the second transducer stage, and in a second mode, the first boost stage is configured to provide the first boosted voltage to the first transducer driver and the second transducer driver.

21. The IC of claim 16, wherein in a first mode, the first and second boosted voltages are equal, and wherein the first and second boost nodes are coupled to a common output node, and in a second mode, the first and second boosted voltages are different, and the first and second boost nodes are isolated from one another.

22. An integrated circuit (IC), comprising:
a first transducer driver for driving a first transducer;
a second transducer driver for driving a second transducer; and
boost circuitry comprising first and second boost nodes, the boost circuitry configurable to boost a supply voltage received at one or more input pins of the IC to provide first and second boosted voltages to respective first and second transducer drivers via respective first and second boost nodes;
wherein the boost circuitry comprises:
a first boost stage configured to boost the supply voltage to the first boosted voltage at the first boost node; and
a second boost stage configured to boost the supply voltage to the second boosted voltage on the second boost node; and wherein in a first mode, the first boost stage is configured to provide the first boosted voltage to the first transducer driver and the second boost stage is configured to provide the second boosted voltage to the second transducer stage, and in a second mode, the first boost stage is configured to provide the first boosted voltage to the first transducer driver and the second transducer driver.

23. The IC of claim 22, wherein the boost circuitry comprises control circuitry configured to switch between the first and second modes in dependence on one or more of the following:
   a) a signal to be output to the first transducer;
   b) a signal to be output to the second transducer;
   c) one or more operational limits of the IC;
   d) a power level available to the IC.

24. The IC of claim 23, wherein the control circuitry is configured to dynamically adjust one or more current limits for each of the first and second transducer drivers in dependence on a total current limit for the IC.

25. An integrated circuit (IC), comprising:
a first boosted amplifier for driving a first transducer;
a second boosted amplifier for driving a second transducer; and
boost circuitry for providing boosted supply voltages to the first and second boosted amplifiers,
wherein the IC is configurable in a first mode and a second mode, wherein:
   in the first mode, the boost circuitry provides separate first and second boosted voltages to separate first and second boosted voltage supply rails, the first boosted voltage for supplying the first boosted amplifier and the second boosted voltage for supplying the second boosted amplifier; and
   in a second mode, the boost circuitry provides a common boosted voltage to a common boost voltage supply rail, the common boosted voltage for supplying the first boosted amplifier and the second boosted amplifier.

26. An integrated circuit (IC), comprising:
a first transducer driver for driving a first transducer;
a second transducer driver for driving a second transducer; and
boost circuitry comprising first and second boost nodes, the boost circuitry configurable to boost a supply voltage received at one or more input pins of the IC to provide first and second boosted voltages to respective first and second transducer drivers via respective first and second boost nodes;
wherein the boost circuitry comprises:
a first boost stage configured to boost the supply voltage to the first boosted voltage at the first boost node; and
a second boost stage configured to boost the supply voltage to the second boosted voltage on the second boost node; and
wherein the boost circuitry is configured to control the first boost stage in antiphase to the second boost stage.

27. An integrated circuit (IC), comprising:
a first transducer driver for driving a first transducer;
a second transducer driver for driving a second transducer; and
boost circuitry comprising first and second boost nodes, the boost circuitry configurable to boost a supply voltage received at one or more input pins of the IC to provide first and second boosted voltages to respective first and second transducer drivers via respective first and second boost nodes;
wherein in a first mode, the first and second boosted voltages are equal, and wherein the first and second boost nodes are coupled to a common output node, and in a second mode, the first and second boosted voltages are different, and the first and second boost nodes are isolated from one another.

28. An integrated circuit (IC), comprising:
a first transducer driver for driving a first transducer;
a second transducer driver for driving a second transducer; and
boost circuitry comprising first and second boost nodes, the boost circuitry configurable to boost a supply voltage received at one or more input pins of the IC to provide first and second boosted voltages to respective first and second transducer drivers via respective first and second boost nodes;
wherein the boost circuitry comprises:
a first switching device coupled between a first inductor node and the first boost node;
a second switching device coupled between the first inductor node and a ground reference voltage;
a third switching device coupled between a second inductor node and the second boost node; and
a fourth switching device coupled between the second inductor node and the ground reference voltage.

* * * * *